(12) United States Patent
Ueno et al.

(10) Patent No.: US 8,213,882 B2
(45) Date of Patent: Jul. 3, 2012

(54) VOLTAGE CONVERTING CIRCUIT AND RADIO COMMUNICATION APPARATUS

(75) Inventors: Takashi Ueno, Kanagawa (JP); Takeshi Ueno, Kanagawa (JP); Takeshi Miyaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 12/724,994

(22) Filed: Mar. 16, 2010

(65) Prior Publication Data

US 2010/0296600 A1 Nov. 25, 2010

(30) Foreign Application Priority Data

May 20, 2009 (JP) ................................ 2009-121728

(51) Int. Cl.
*H04B 1/04* (2006.01)
*H02M 11/00* (2006.01)

(52) U.S. Cl. ..................................... 455/114.2; 327/103

(58) Field of Classification Search .................... 455/91, 455/114.2; 327/100, 103
See application file for complete search history.

(56) References Cited

U.S. PATENT DOCUMENTS

| 6,011,436 A * | 1/2000 | Koike ........................... 330/253 |
| 2002/0074983 A1 * | 6/2002 | Yuen ............................. 323/315 |

FOREIGN PATENT DOCUMENTS

| JP | 02-206210 | 8/1990 |
| JP | 2002-076800 | 3/2002 |

* cited by examiner

*Primary Examiner* — Nguyen Vo
(74) *Attorney, Agent, or Firm* — Turocy & Watson, LLP

(57) ABSTRACT

A common resistor is connected to load impedances that convert differential currents respectively generated by current sources into differential voltages. A constant current generated by the current sources is supplied to the common resistor to cause the common resistor to generate an in-phase current and set a common potential.

20 Claims, 4 Drawing Sheets

VOLTAGE CONVERTING CIRCUIT AND RADIO COMMUNICATION APPARATUS

CROSS-REFERENCE TO RELATED APPLICATIONS

This application is based upon and claims the benefit of priority from the prior Japanese Patent Application No. 2009-121728, filed on May 20, 2009; the entire contents of which are incorporated herein by reference.

BACKGROUND OF THE INVENTION

1. Field of the Invention

The present invention relates to a voltage converting circuit and a radio communication apparatus, and, more particularly is suitably applied to a method of converting a common potential of a differential signal.

2. Description of the Related Art

In a circuit on which a digital circuit and an analog circuit are mixed, in some case, a signal treated by the analog circuit is differentiated to prevent deterioration in the quality of an analog signal due to digital noise.

When circuit blocks having different DC levels are directly coupled to each other, the circuit blocks do not normally operate. Therefore, in general, a capacitor is interposed between the circuit blocks to interrupt a DC component.

For example, Japanese Patent Application Laid-Open No. 2002-76800 discloses a method of increasing a sum of electric currents flowing to a pair of transistors in proportion to an input differential voltage to realize linear subtraction and addition functions over a wide input voltage range. Gates of the transistors form an input pair, drains thereof form a subtraction output pair, and sources thereof are connected in common to form an addition output terminal.

However, in the method of interposing the capacitor between the circuit blocks, bands up to near the DC component are interrupted. Therefore, the method cannot be applied to, for example, a communication system that needs to allow the bands up to near the DC component to pass.

In the method disclosed in Japanese Patent Application Laid-Open No. 2002-76800, a differential signal is converted into a single-phase signal by a differential circuit on an output side and a common potential generated by the input pair is cancelled. Therefore, it is impossible to adjust a common potential of the differential signal while allowing the differential signal to be transmitted.

BRIEF SUMMARY OF THE INVENTION

A voltage converting circuit according to an embodiment of the present invention comprises: first and second current sources that generate differential currents; first and second load impedances that are respectively connected to the first and second current sources in series and convert differential currents flowing to the first and second current sources into differential voltages; a common resistor connected in common to the first and second load impedances; and a third current source that supplies a constant current to the common resistor to cause the common resistor to generate an in-phase voltage.

A voltage converting circuit according to an embodiment of the present invention comprises: first and second current sources that generate differential currents; first and second load resistors that are respectively connected to the first and second current sources in series and convert differential currents flowing to the first and second current sources into differential voltages; and third and fourth current sources that are respectively connected to the first and second current sources in parallel and respectively supply a constant current to the first and second load resistors to cause the first and second load resistors to generate in-phase voltages.

A radio communication apparatus according to an embodiment of the present invention comprises: a baseband processing circuit that performs baseband processing of a digital transmission signal and coverts the transmission signal into a differentiated analog signal; an RF front-end circuit that converts the transmission signal differentiated by the baseband processing signal into a radio frequency band; and a voltage converting circuit that converts a DC level of the transmission signal differentiated by the baseband processing circuit into a DC level of the RF front-end circuit, wherein the voltage converting circuit includes: first and second current sources that generate differential currents based on the transmission signal differentiated by the baseband processing circuit; first and second load impedances that are respectively connected to the first and second current sources in series and convert differential currents flowing to the first and second current sources into differential voltages; a common resistor connected in common to the first and second load impedances; a third current source that supplies a constant current to the common resistor to cause the common resistor to generate an in-phase voltage; and first and second output terminals that output the differential voltages converted by the first and second load impedances to the RF front-end circuit.

DETAILED DESCRIPTION OF THE INVENTION

Exemplary embodiments of the present invention are explained in detail below with reference to the accompanying drawings. The present invention is not limited by the embodiments.

Figure 1:
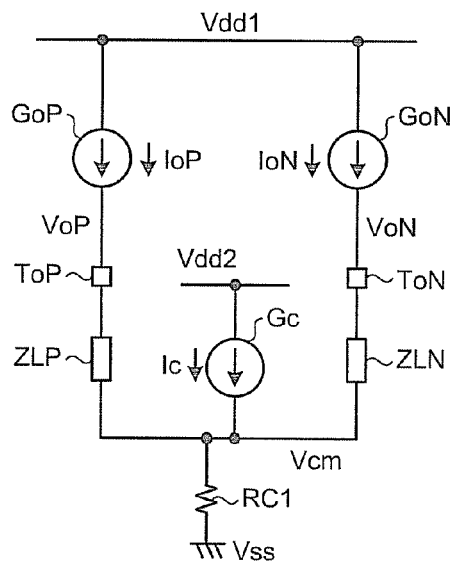
FIG. 1 is a block diagram of the schematic configuration of a voltage converting circuit according to a first embodiment of the present invention.

FIG. 1 is a block diagram of the schematic configuration of a voltage converting circuit according to a first embodiment of the present invention.

In FIG. 1, the voltage converting circuit includes current sources GoP and GoN that respectively generate differential currents IoP and IoN, load impedances ZLP and ZLN that convert the differential currents IoP and IoN into differential voltages VoP and VoN, a common resistor RC1 that generates an in-phase voltage to set a common potential Vcm, and a current source Gc that supplies a constant current Ic to the common resistor RC1. As the current source Gc, for example, a current mirror circuit can be used.

One ends of the current sources GoP and GoN are connected to a power supply potential Vdd1. The other ends of the current sources GoP and GoN are connected to one ends of the load impedances ZLP and ZLN. The other ends of the load impedances ZLP and ZLN are connected to one end of the common resistor RC1. The other end of the common resistor RC1 is connected to a reference potential Vss. The reference potential Vss can be set to, for example, the ground potential.

One end of the current source Gc is connected to a power supply potential Vdd2. The other end of the current source Gc is connected to one end of the common resistor RC1. The power supply potential Vdd2 can be set to a value lower than the power supply potential Vdd1. Differential output terminals ToP and ToN are respectively provided at connection points between the current sources GoP and GoN and the load impedances ZLP and ZLN.

The electric current Ic generated by the current source Gc is supplied to the common resistor RC1 and the in-phase voltage is generated by the common resistor RC1. Consequently, the common potential Vcm is set at a connection point between the load impedances ZLP and ZLN and the common resistor RC1.

On the other hand, the differential currents IoP and IoN respectively generated by the current sources GoP and GoN are respectively converted into the differential voltages VoP and VoN by the load impedances ZLP and ZLN. The differential voltages VoP and VoN are output via the differential output terminals ToP and ToN while the amplitude of the differential voltages VoP and VoN oscillates across the common voltage Vcm.

It is possible to set common potentials Vcm of the differential output terminals ToP and ToN to coincide with each other by causing the common resistor RC1 connected in common to the load impedance ZLP and ZLN to set the common potential Vcm. It is possible to adjust a DC level of a differential signal without causing DC offset. Therefore, it is possible to directly couple circuit blocks having different DC levels without interposing a capacitor between the circuit blocks. As a result, it is possible to cause a communication circuit that needs to allow bands up to near a DC component to pass to normally operate.

It is unnecessary to feed the electric current Ic for setting the common potential Vcm to the load impedances ZLP and ZLN. Therefore, it is possible to set the electric current Ic without depending on values of the load impedances ZLP and ZLN. Therefore, even when the values of the load impedances ZLP and ZLN are small, it is possible to secure a sufficient common potential Vcm without increasing the electric current Ic. As a result, it is possible to suppress an increase in power consumption.

Further, the current source Gc is connected to the connection point between the load impedances ZLP and ZLN and the common resistor RC1. This makes it possible to set the power supply potential Vdd2 of the current source Gc irrespectively of the potentials of the differential output terminals ToP and ToN. Therefore, even when the power supply potential Vdd2 is set to a value lower than the power supply potential Vdd1, it is possible to prevent the potentials of the differential output terminals ToP and ToN from being limited by the power supply potential Vdd2. As a result, it is possible to reduce a power loss in the current source Gc.

Figure 2:
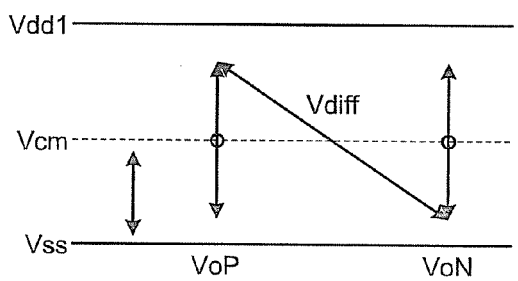
FIG. 2 is a diagram for explaining a method of setting a common potential in the voltage converting circuit shown in FIG. 1.

FIG. 2 is a diagram for explaining a method of setting a common potential in the voltage converting circuit shown in FIG. 1.

In FIG. 2, the amplitude of the differential voltages VoP and VoN oscillates across the common potential Vcm. The common potential Vcm can be set irrespectively of the power supply potential Vdd1. Therefore, it is possible to secure a maximum differential voltage Vdiff between the differential voltages VoP and VoN.

Figure 3:
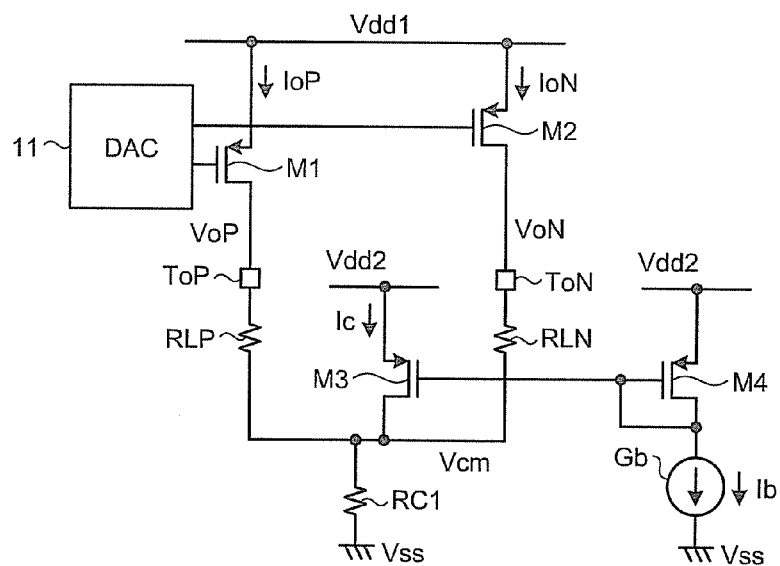
FIG. 3 is a circuit diagram of the schematic configuration of a voltage converting circuit according to a second embodiment of the present invention.

FIG. 3 is a circuit diagram of the schematic configuration of a voltage converting circuit according to a second embodiment of the present invention.

In FIG. 3, in the voltage converting circuit, a field effect transistor M1 is provided as the current source GoP shown in FIG. 1. A field effect transistor M2 is provided as the current source GoN shown in FIG. 1. Field effect transistors M3 and M4 and a current source Gb are provided as the current source Gc shown in FIG. 1. Load resistors RLP and RLN are respectively provided as the load impedances ZLP and ZLN shown in FIG. 1.

Drains of the field effect transistors M1 and M2 are connected to the power supply potential Vdd1. Sources of the field effect transistors M1 and M2 are respectively connected to one ends of the load resistors RLP and RLN. The other ends of the load resistors RLP and RLN are connected to one end of the common resistor RC1. The other end of the common resistor RC1 is connected to the reference potential Vss. Gates of the field effect transistors M1 and M2 are connected to a differential output terminal of a digital-to-analog (DA) converter 11.

Drains of the field effect transistors M3 and M4 are connected to the power supply potential Vdd2. A source of the field effect transistor M3 is connected to one end of the common resistor RC1. A source of the field effect transistor M4 is connected to one end of the current source Gb. The other end of the current source Gb is connected to the reference potential Vss. Gates of the field effect transistors M3 and M4 are connected to the source of the field effect transistor M4.

When an electric current Ib is generated by the current source Gb, the electric current Ic corresponding to the electric current Ib flows to the field effect transistor M3 according to the current mirror operation of the field effect transistors M3 and M4. The electric current Ib is supplied to the common resistor RC1. When the electric current Ic is supplied to the common resistor RC1, an in-phase voltage is generated by the common resistor RC1. Consequently, the common potential Vcm is set at a connection point between the load resistors RLP and RLN and the common resistor RC1.

On the other hand, when a differential signal is input to the gates of the field effect transistors M1 and M2 from the DA converter 11, the differential currents IoP and IoN corresponding to the differential signal are respectively generated by the field effect transistors M1 and M2. The differential currents IoP and IoN respectively generated by the field effect transistors M1 and M2 are respectively converted into the differential voltages VoP and VoN by the load resistors RLP and RLN. The differential voltages VoP and VoN are output via the differential output terminals ToP and ToN while the amplitude of the differential voltages VoP and VoN oscillates across the common potential Vcm.

This makes it possible to cause the common resistor RC1 connected in common to the load resistors RLP and RLN to set the common potential Vcm. Even when the differential voltages VoP and VoN are output via the differential output terminals ToP and ToN, it is possible to adjust DC levels of the differential voltages VoP and VoN without causing DC offset.

Figure 4:
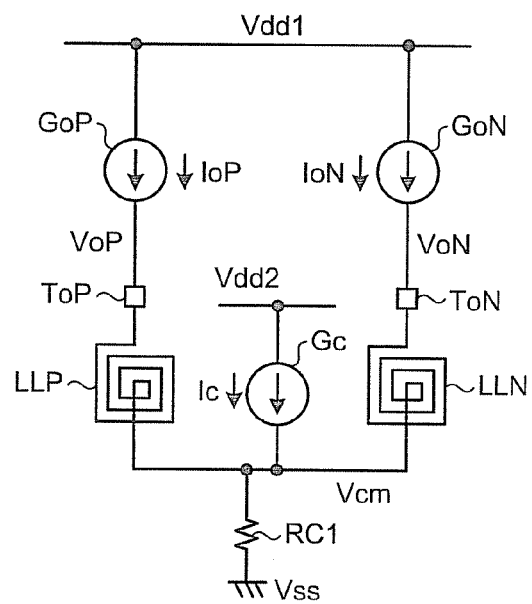
FIG. 4 is a block diagram of the schematic configuration of a voltage converting circuit according to a third embodiment of the present invention.

FIG. 4 is a block diagram of the schematic configuration of a voltage converting circuit according to a third embodiment of the present invention.

In FIG. 4, in the voltage converting circuit, load inductors LLP and LLN are respectively provided as the load impedances ZLP and ZLN shown in FIG. 1. One ends of the load inductors LLP and LLN are connected to the other ends of the current sources GoP and GoN. The other ends of the load inductors LLP and LLN are connected to one end of the common resistor RC1.

The load inductors LLP and LLN are used as the load impedances ZLP and ZLN. This makes it possible to reduce DC voltage drop and suppress a fall in conversion efficiency even when the voltage converting circuit is applied to a high-frequency circuit.

The common potential Vcm is set by the common resistor RC1 irrespectively of the load inductors LLP and LLN. Therefore, even when the load inductors LLP and LLN are used as the load impedances ZLP and ZLN, it is possible to cause the common resistor RC1 to set the common potential Vcm to an appropriate value.

Figure 5:
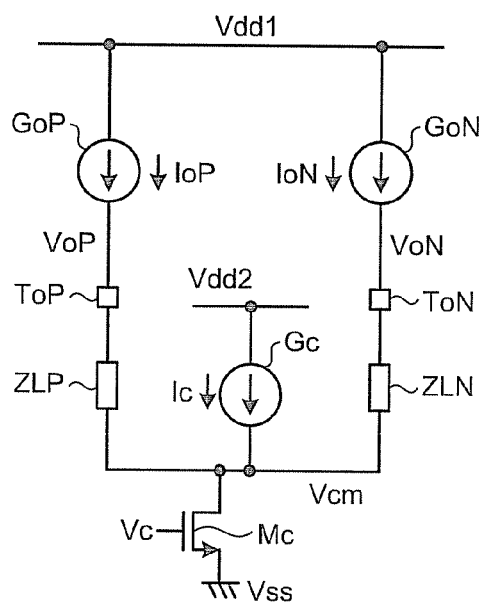
FIG. 5 is a block diagram of the schematic configuration of a voltage converting circuit according to a fourth embodiment of the present invention.

FIG. 5 is a block diagram of the schematic configuration of a voltage converting circuit according to a fourth embodiment of the present invention.

In FIG. 5, in the voltage converting circuit, a field effect transistor Mc is provided as the common resistor RC1 shown in FIG. 1. A drain of the field effect transistor Mc is connected to a connection point between the load impedances ZLP and ZLN. A source of the field effect transistor Mc is connected to the reference potential Vss.

A control voltage Vc is applied to a gate of the field effect transistor Mc, whereby a channel resistance of the field effect transistor Mc is controlled and the common potential Vcm is adjusted.

Because the field effect transistor Mc is provided as the common resistor RC1, it is possible to change the common potential Vcm without changing the electric current Ic. Even when a DC level of a circuit to which the differential voltages VoP and VoN are output is switched, it is possible to realize direct coupling.

Figure 6:
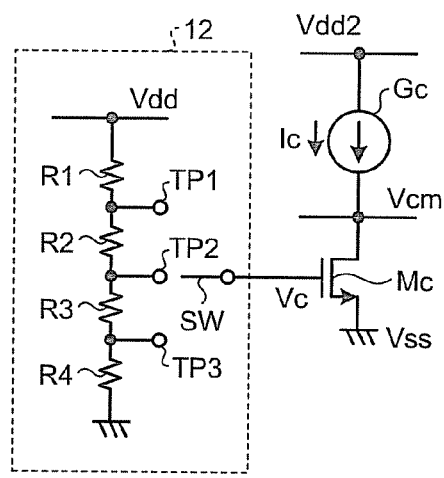
FIG. 6 is a circuit diagram of the schematic configuration of a common-potential adjusting circuit applied to a voltage converting circuit according to a fifth embodiment of the present invention.

FIG. 6 is a circuit diagram of the schematic configuration of a common potential adjusting circuit applied to a voltage converting circuit according to a fifth embodiment of the present invention.

In FIG. 6, a common potential adjusting circuit 12 includes voltage dividing resistors R1 to R4 that divide a power supply potential Vdd, taps TP1 to TP3 that extract divided voltages, and a switch SW that switches the taps TP1 to TP3.

The voltage dividing resistors R1 to R4 are connected to one another in series. The taps TP1 to TP3 are respectively connected to connection points among the voltage dividing resistors R1 to R4. One end of the switch SW is connected to the gate of the field effect transistor Mc.

The power supply potential Vdd is divided by the voltage dividing resistors R1 to R4 and divided voltages are output to the taps TP1 to TP3. The other end of the switch SW is switched among the taps TP1 to TP3, whereby the control voltage is changed. The control voltage Vc is applied to the gate of the field effect transistor Mc, whereby the channel resistance of the field effect transistor Mc is controlled and the common potential Vcm is adjusted.

Figure 7:
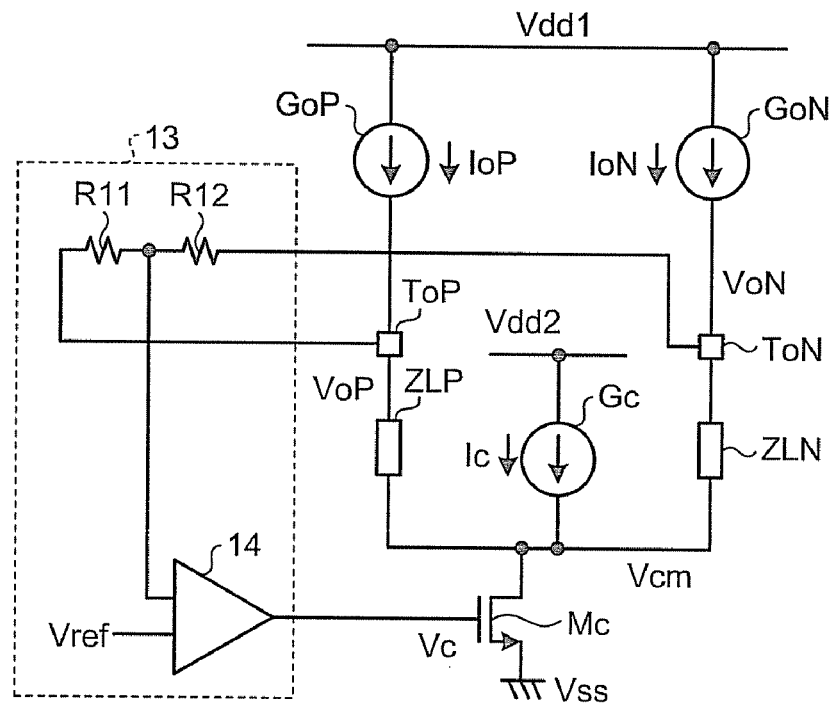
FIG. 7 is a circuit diagram of the schematic configuration of a common-potential adjusting circuit applied to a voltage converting circuit according to a sixth embodiment of the present invention.

FIG. 7 is a circuit diagram of the schematic configuration of a common potential adjusting circuit applied to a voltage converting circuit according to a sixth embodiment of the present invention.

In FIG. 7, a common-potential adjusting circuit 13 includes detection resistors R11 and R12 that detect an intermediate potential between the differential output terminals ToP and ToN and an operational amplifier 14 that compares the intermediate potential detected by the detection resistors R11 and R12 with a reference voltage Vref.

The detection resistors R11 and R12 are connected to each other in series. A series circuit of the detection resistors R11 and R12 is connected between the differential output terminals ToP and ToN. One input terminal of the operational amplifier 14 is connected to a connection point between the detection resistors R11 and R12. The reference voltage Vref is input to the other input terminal of the operational amplifier 14.

The intermediate potential between the differential output terminals ToP and ToN is detected by the detection resistors R11 and R12 and compared with the reference voltage Vref by the operational amplifier 14. A difference between the intermediate potential between the differential output terminals ToP and ToN and the reference voltage Vref is output to the gate of the field effect transistor Mc as the control voltage Vc. Consequently, the channel resistance of the field effect transistor Mc is controlled such that the intermediate potential between the differential output terminals ToP and ToN coincides with the reference voltage Vref.

Figure 8:
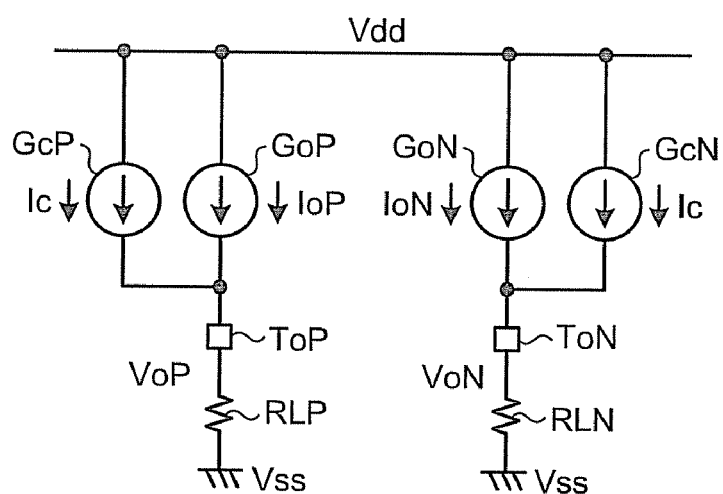
FIG. 8 is a block diagram of the schematic configuration of a voltage converting circuit according to a seventh embodiment of the present invention.

FIG. 8 is a block diagram of the schematic configuration of a voltage converting circuit according to a seventh embodiment of the present invention.

In FIG. 8, the voltage converting circuit includes the current sources GoP and GoN that respectively generate the differential currents IoP and IoN, current sources GcP and GcN that respectively generate in-phase currents Ic, and the load resistors RLP and RLN that convert the differential currents IoP and IoN into the differential voltages VoP and VoN and convert the in-phase currents Ic into in-phase voltages to set a common potential. As the current sources GcP and GcN, for example, a current mirror circuit can be used.

One ends of the current sources GoP and GoN are connected to the power supply potential Vdd. The other ends of the current sources GoP and GoN are connected to one ends of the load resistors RLP and RLN. The other ends of the load resistors RLP and RLN are connected to the reference potential Vss. The current sources GcP and GcN are respectively connected to the current sources GoP and GoN in parallel. The differential output terminals ToP and ToN are respectively provided at connection points between the current sources GoP and GoN and the load resistors RLP and RLN.

The in-phase currents Ic respectively generated by the current sources GcP and GcN are respectively supplied to the load resistors RLP and RLN and converted into in-phase voltages by the load resistors RLP and RLN. Consequently, a common potential is set at the connection points between the current sources GoP and GoN and the load resistors RLP and RLN.

On the other hand, the differential currents IoP and IoN respectively generated by the current sources GoP and GoN are respectively converted into the differential voltages VoP and VoN by the load resistors RLP and RLN. The differential voltages VoP and VoN are output via the differential output terminals ToP and ToN while the amplitude of the differential voltages VoP and VoN oscillates across the common potential.

This makes it possible to cause the load resistors RLP and RLN respectively connected to the current sources GoP and GoN to set a common potential. Even when the differential currents IoP and IoN are respectively generated by the current sources GoP and GoN, it is possible to adjust DC levels of the differential voltages VoP and VoN.

In the embodiment shown in FIG. 8, the method of causing the current sources GcP and GcN to respectively generate the in-phase currents Ic having the same value is explained. However, values of in-phase currents generated by the current sources GcP and GcN can be separately set. This makes it possible to separately set common potentials of the differential output terminals ToP and ToN. Even when there is fluctuation in values of the load resistors RLP and RLN, it is possible to equalize the common potentials of the differential output terminals ToP and ToN.

Figure 9:
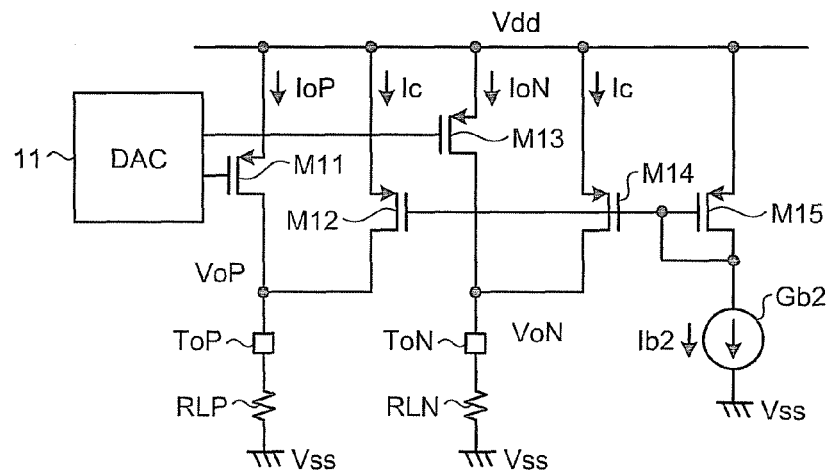
FIG. 9 is a circuit diagram of the schematic configuration of a voltage converting circuit according to an eighth embodiment of the present invention.

FIG. 9 is a circuit diagram of the schematic configuration of a voltage converting circuit according to an eighth embodiment of the present invention.

In FIG. 9, in the voltage converting circuit, a field effect transistor Nil is provided as the current source GoP shown in FIG. 8. A field effect transistor M13 is provided as the current source GoN shown in FIG. 8. Field effect transistors M12, M14, and M15 and a current source Gb2 are provided as the current sources GcP and GcN shown in FIG. 8.

Drains of the field effect transistors M11 and M13 are connected to the power supply potential Vdd. Sources of the field effect transistors M11 and M13 are respectively connected to one ends of the load resistors RLP and RLN. The other ends of the load resistors RLP and RLN are connected to the reference potential Vss. Gates of the field effect transistors M11 and M13 are connected to the differential output terminal of the DA converter 11.

Drains of the field effect transistors M12, M14, and M15 are connected to the power supply potential Vdd. A source of the field effect transistor M12 is connected to one end of the load resistor RLP. A source of the field effect transistor M14 is connected to one end of the load resistor RLN. A source of the field effect transistor M15 is connected to one end of the current source Gb2. The other end of the current source Gb2 is connected to the reference potential Vss. Gates of the field effect transistors M12, M14, and M15 are connected to the source of the field effect transistors M15.

When an electric current Ib2 is generated by a current source G2b, in-phase currents Ic corresponding to the electric current Ib2 flow to the field effect transistors M12 and M14 according to the current mirror operation of the field effect transistors M12, M14, and 15 and are respectively supplied to the load resistors RLP and RLN. When the in-phase currents Ic are respectively supplied to the load resistors RLP and RLN, the in-phase currents Ic are respectively converted into in-phase voltages by the load resistors RLP and RLN. Consequently, common potentials are set at connection points between the sources of the field effect transistors M11 and M13 and the load resistors RLP and RLN.

On the other hand, when a differential signal is input to the gates of the field effect transistors M11 and M13 from the DA converter 11, the differential currents IoP and IoN corresponding to the differential signal are respectively generated by the field effect transistors M11 and M13. The differential currents IoP and IoN respectively generated by the field effect transistors M11 and M13 are respectively converted into the differential voltages VoP and VoN by the load resistors RLP and RLN. The differential voltages VoP and VoN are output via the differential output terminals ToP and ToN while the amplitude of the differential voltages VoP and VoN oscillates across the common potential.

Figure 10:
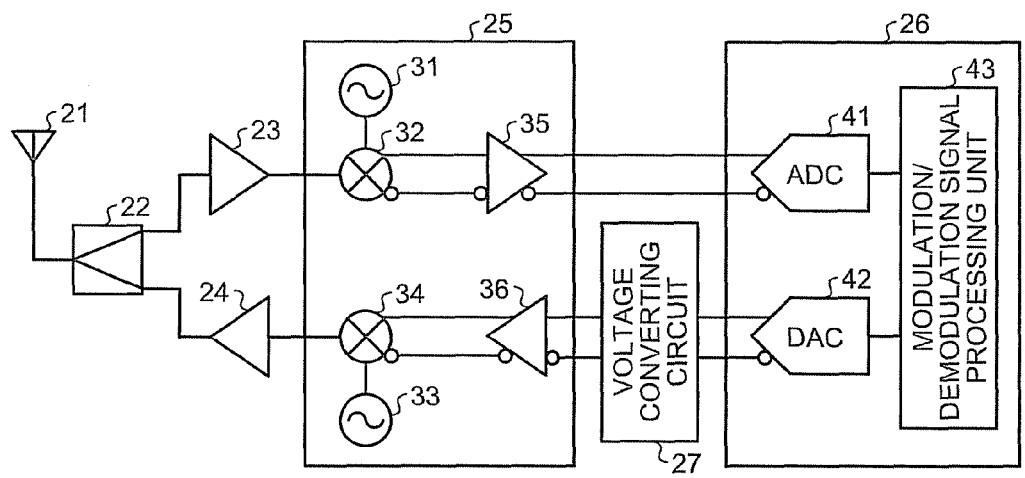
FIG. 10 is a block diagram of the schematic configuration of a radio communication apparatus to which a voltage converting circuit according to a ninth embodiment of the present invention is applied.

FIG. 10 is a block diagram of the schematic configuration of a radio communication apparatus to which a voltage converting circuit according to a ninth embodiment of the present invention is applied.

In FIG. 10, the radio communication apparatus includes a communication antenna 21 that performs transmission and reception of a radio wave, an antenna duplexer 22 that duplexes the communication antenna 21 in the transmission and reception, a low-noise amplifier 23 that amplifies a reception signal received via the communication antenna 21, a power amplifier 24 that amplifies a transmission signal transmitted via the communication antenna 21, an radio frequency (RF) front-end circuit 25 that performs frequency conversion of the reception signal and the transmission signal, and a baseband processing circuit 26 that performs baseband processing of the reception signal and the transmission signal. As the antenna duplexer 22, when a communication system is a time division duplex (TDD) system, a switch can be used. When the communication system is a frequency division duplex (FDD) system, a duplexer can be used. The RF front-end circuit 25 and the baseband processing circuit 26 can be mounted on separate IC chips.

The RF front-end circuit 25 includes a local oscillator 31 that generates a local oscillation signal for down-converting the reception signal, a local oscillator 33 that generates a local oscillation signal for up-converting the transmission signal, a mixer 32 that multiplies the reception signal with the local oscillation signal generated by the local oscillator 31 to down-convert the reception signal, a mixer 34 that multiplies the transmission signal with the local oscillation signal generated by the local oscillator 33 to up-convert the transmission signal, a differential amplifier 35 that differentially amplifies the reception signal down-converted by the mixer 32, and a differential amplifier 36 that differentially amplifies the transmission signal up-converted by the mixer 34.

The baseband processing circuit 26 includes an analog-to-digital (AD) converter 41 that converts the reception signal differentially amplified by the differential amplifier 35 into a digital signal, a digital-to-analog (DA) converter 42 that converts the transmission signal differentially amplified by the differential amplifier 36 into an analog signal, and a modulation/demodulation signal processing unit 43 that performs modulation and demodulation of the reception signal, which is converted into the digital signal, and the transmission signal in a baseband.

The DA converter 42 is directly coupled to the differential amplifier 36 via a voltage converting circuit 27. As the voltage converting circuit 27, the voltage converting circuit shown in any one of FIG. 1 and FIGS. 3 to 9 can be used.

When reception processing is performed in the radio communication apparatus, the reception signal received via the communication antenna 21 is amplified by the low-noise amplifier 23 and then down-converted by the mixer 32. A differential signal frequency-converted to the baseband is output to the differential amplifier 35. The differential signal is amplified by the differential amplifier 35 and then converted into a digital signal by the AD converter 41 and subjected to demodulation processing by the modulation/demodulation signal processing unit 43.

On the other hand, when transmission processing is performed in the radio communication apparatus, the transmission signal in the baseband subjected to modulation processing by the modulation/demodulation signal processing unit 43 is converted into an analog signal by the DA converter 42. The differential signal converted into the analog signal is output to the voltage converting circuit 27. When the differential signal is output to the voltage converting circuit 27, the differential signal is output to the differential amplifier 36 with a DC level of the differential signal at that point converted into a DC level in the differential amplifier 36. The differential signal, the DC level of which is converted by the voltage converting circuit 27, is amplified by the differential amplifier 36 and then up-converted by the mixer 34, amplified by the power amplifier 24, and transmitted via the communication antenna 21.

In the embodiment explained above, the voltage converting circuit 27 is provided between the RF front-end circuit 25 and the baseband processing circuit 26. However, the voltage converting circuit 27 can be incorporated in the RF front-end circuit 25 or the baseband processing circuit 26.

In the embodiment explained above, the method of applying the voltage converting circuit 27 to the radio communication apparatus in which the RF front-end circuit 25 and the baseband processing circuit 26 are directly coupled is explained. However, the present invention is not limited to the method of applying the voltage converting circuit 27 to the radio communication apparatus. For example, the voltage converting circuit 27 can be applied to a multistage amplifier circuit in which a pre-stage and a post-stage are directly coupled.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A voltage converting circuit comprising:
   first and second current sources that generate differential currents;
   first and second load impedances that are respectively connected to the first and second current sources in series and convert differential currents flowing to the first and second current sources into differential voltages;
   a common resistor connected in common to the first and second load impedances; and
   a third current source that supplies a constant current to the common resistor to cause the common resistor to generate an in-phase voltage.

2. The voltage converting circuit according to claim 1, wherein the first and second load impedances are resistors.

3. The voltage converting circuit according to claim 1, wherein the first and second load impedances are inductors.

4. The voltage converting circuit according to claim 1, wherein the third current source is a current mirror circuit.

5. The voltage converting circuit according to claim 1, wherein a common potential of a first differential output terminal provided at a connection point between the first current source and the first load impedance and a common potential of a second differential output terminal provided at a connection point between the second current source and the second load impedance are equal to each other.

6. The voltage converting circuit according to claim 1, wherein a power supply potential of the third current source is lower than a power supply potential of the first and second current sources.

7. The voltage converting circuit according to claim 1, wherein a value of an electric current generated by the third current source is set without depending on values of the first and second load impedances.

8. The voltage converting circuit according to claim 1, wherein a power supply potential of the third current source is set irrespectively of potentials of a first differential output terminal provided at a connection point between the first current source and the first load impedance and a second differential output terminal provided at a connection point between the second current source and the second load impedance.

9. The voltage converting circuit according to claim 1, wherein common potentials of a first differential output terminal provided at a connection point between the first current source and the first load impedance and a second differential output terminal provided at a connection point between the second current source and the second load impedance are set irrespectively of power supply potentials of the first and second current sources.

10. The voltage converting circuit according to claim 9, wherein the common potentials are set as intermediate potentials between the power supply potentials of the first and second current sources and a reference potential.

11. The voltage converting circuit according to claim 1, wherein
   the common resistor is a field effect transistor, and
   the voltage converting circuit further comprises a common-potential adjusting circuit that adjusts a gate voltage of the field effect transistor to adjust the in-phase voltage.

12. The voltage converting circuit according to claim 11, wherein the common-potential adjusting circuit includes:
   a voltage dividing resistor that divides a power supply potential;
   taps that extract divided voltages divided by the voltage dividing resistor; and
   a switch that switches the taps.

13. The voltage converting circuit according to claim 11, wherein the common-potential adjusting circuit includes:
   a detection resistor that detects an intermediate potential between a potential of a first differential output terminal provided at a connection point between the first current source and the first load impedance and a potential of a second differential output terminal provided at a connection point between the second current source and the second load impedance; and
   an operational amplifier that adjusts a gate voltage of the field effect transistor based on a comparison result of the intermediate potential detected by the detection resistor and a reference voltage.

14. A voltage converting circuit comprising:
   first and second current sources that generate differential currents;
   first and second load resistors that are respectively connected to the first and second current sources in series and convert differential currents flowing to the first and second current sources into differential voltages; and
   third and fourth current sources that are respectively connected to the first and second current sources in parallel and respectively supply a constant current to the first and second load resistors to cause the first and second load resistors to generate in-phase voltages.

15. The voltage converting circuit according to claim 14, wherein the third and fourth current sources are current mirror circuits.

16. The voltage converting circuit according to claim 14, wherein values of in-phase currents generated by the third and fourth current sources are separately set.

17. A radio communication apparatus comprising:
- a baseband processing circuit that performs baseband processing of a digital transmission signal and coverts the transmission signal into a differentiated analog signal;
- an RF front-end circuit that converts the transmission signal differentiated by the baseband processing signal into a radio frequency band; and
- a voltage converting circuit that converts a DC level of the transmission signal differentiated by the baseband processing circuit into a DC level of the RF front-end circuit, wherein
- the voltage converting circuit includes:
    - first and second current sources that generate differential currents based on the transmission signal differentiated by the baseband processing circuit;
    - first and second load impedances that are respectively connected to the first and second current sources in series and convert differential currents flowing to the first and second current sources into differential voltages;
    - a common resistor connected in common to the first and second load impedances;
    - a third current source that supplies a constant current to the common resistor to cause the common resistor to generate an in-phase voltage; and
    - first and second output terminals that output the differential voltages converted by the first and second load impedances to the RF front-end circuit.

18. The radio communication apparatus according to claim 17, wherein the first and second load impedances are resistors.

19. The radio communication apparatus according to claim 17, wherein the first and second load impedances are inductors.

20. The radio communication apparatus according to claim 17, wherein the third current source is a current mirror circuit.

\* \* \* \* \*